United States Patent [19]

Gonin et al.

[11] 4,257,019
[45] Mar. 17, 1981

[54] CHARGE TRANSFER RECURSIVE FILTER

[75] Inventors: Roger B. Gonin; Sylvain Fontanes; Jean E. Picquendar, all of Paris, France

[73] Assignee: Thomson-CSF, Paris, France

[21] Appl. No.: 96,327

[22] Filed: Nov. 21, 1979

[30] Foreign Application Priority Data

Nov. 21, 1978 [FR] France .................... 78 32766

[51] Int. Cl.³ .................. H03H 15/02; H03H 17/04; H11C 19/28
[52] U.S. Cl. .................... 333/165; 307/221 C; 307/221 D; 333/166
[58] Field of Search .............. 333/165, 166; 328/167; 307/221 R, 221 C, 221 D; 357/24

[56] References Cited

U.S. PATENT DOCUMENTS

| | | | |
|---|---|---|---|
| 4,038,536 | 7/1977 | Feintuch | 333/166 X |
| 4,052,559 | 10/1977 | Paul et al. | 333/166 |
| 4,145,675 | 3/1979 | Picquendar | 333/165 |

Primary Examiner—Marvin L. Nussbaum
Attorney, Agent, or Firm—Roland Plottel

[57] ABSTRACT

As all the weighting coefficients of the filter are positive, a weighted charge quantity is collected by a line beneath one of the elementary electrodes of each weighting electrode. A charge reading device is coupled to the line and supplies an electrical signal which is transmitted to the negative input of a differential amplifier, which receives the sampled input voltage of the filter at its positive input. The electrical output signal of the filter is taken, under low impedance, at the output of the differential amplifier, said signal being reinjected at the input of the filter by the injecting means.

3 Claims, 2 Drawing Figures

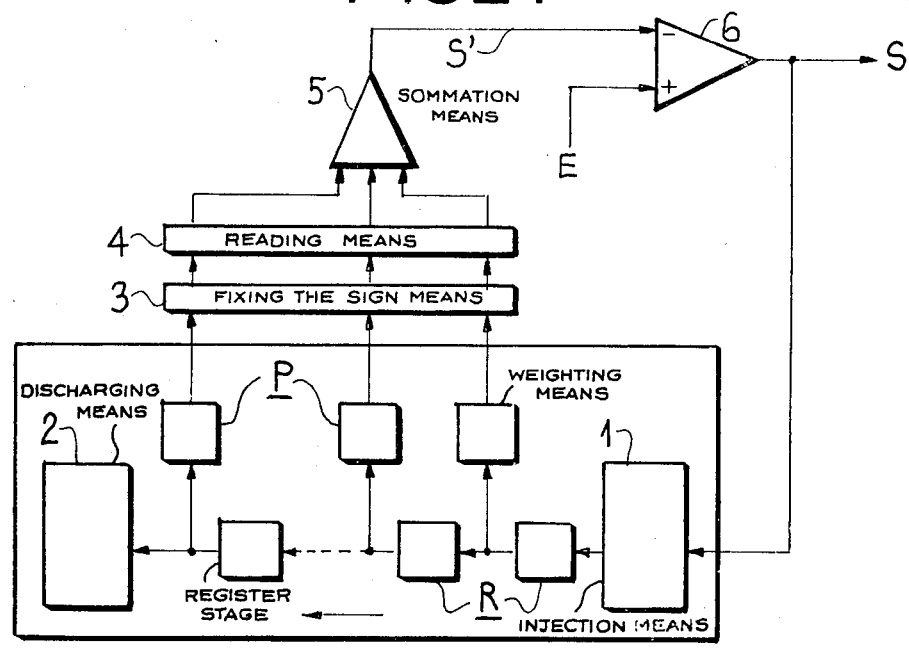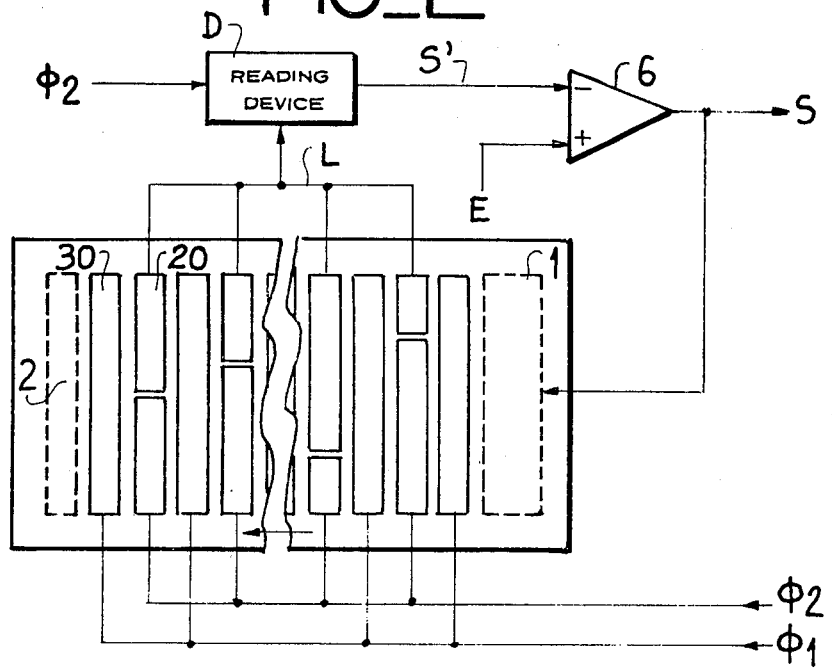

4,257,019

CHARGE TRANSFER RECURSIVE FILTER

BACKGROUND OF THE INVENTION

The present invention relates to a charge transfer recursive filter.

It is pointed out that a charge transfer filter essentially comprises:

a shift register for the transfer for electrical charges on a semiconductor substrate and covered by an insulating layer on which are provided transfer electrodes, which are arranged parallel to one another and transversely with respect to the direction of the charges. In the case of a periodic application of given potentials, these electrodes ensure the transfer of charges into the substrate from one register stage to the next.

weighting means connected to the output of the stages of the shift register, which allocate a weighting coefficient to the quantity of charges having passed through each stage.

In a recursive filter, electrical signal for reading quantities of weighted charges is again injected at the filter input after having been phase displaced by 180°. This signal is generally supplied to the negative input of a differential amplifier, which receives at its positive input samples of the electrical input signal to be filtered. The output signal of the differential amplifier is applied to means ensuring the injection of charges, located at the input of the register in accordance with the charge transfer direction.

In the prior art recursive filters, the electrical output signal of the filter is constituted by the electrical signal for reading the quantities of weighted charges collected on leaving the shift register upstream of the differential amplifier.

BRIEF SUMMARY OF THE INVENTION

The present invention relates to a recursive filter for the transfer of electrical charges in which the electrical output signal of the filter is taken at a low impedance at the output of the differential amplifier.

The recursive filter according to the invention has the advantage that in the case where all its weighting coefficients are positive, it is possible to render an amplifier superfluous. It therefore has the advantage of reducing the surface area of the semiconductor substrate necessary for the realisation thereof. As a result, the cost and overall dimensions of the recursive filter with positive weighting coefficients are greatly reduced.

BRIEF DESCRIPTION OF THE DRAWINGS

The invention will be described in greater detail hereinafter relative to an exemplified and non-limitative embodiment and with reference to the attached drawings, wherein show:

FIG. 1 a basic diagram of a recursive filter for the transfer of electrical charges according to the invention.

FIG. 2 an embodiment of a recursive filter with positive weighting coefficients according to the invention.

DETAILED DESCRIPTION OF THE PREFERRED EMBODIMENTS

In the drawings, the same reference numerals designate the same elements and, for reasons of clarity, the dimensions and proportions of the various elements have not been respected. FIG. 1 is a basic circuit diagram of an electrical charge transfer recursive filter according to the invention.

The recursive filter according to the invention comprises a charge transfer shift register R, which is realised on a semiconductor substrate, covered with an insulating layer. The direction of transferring the charges from one register stage to the next is indicated by an arrow.

Means 1 located at the register input in accordance with the charge transfer direction make it possible to inject into the shift register quantities of charges corresponding to the electrical output signal S of the recursive filter according to the invention. Means 2 make it possible to discharge the charges having passed through the final stage of the register.

Weighting means P, connected to the output of the register stages assign the quantities of charges having passed through each stage with a weighting coefficient.

Means 3 fix the sign of the weighting coefficients and reading means 4 and summation means 5 for the quantities of weighted charges supply an electrical signal S' transmitted to the negative input of a differential amplifier 6. At its positive input, said differential amplifier receives the sampled input voltage E of the recursive filter. The output signal S of the amplifier is taken at the output of differential amplifier 6, said output being connected to the charge injection means. Thus, the output signal S of the recursive filter according to the invention is obtained under a low impedance.

FIG. 2 shows an embodiment of a recursive filter with positive weighting coefficients according to the invention, said filters having a very considerable advantage due to their simple construction and in particular the simplicity of their reading means. They only have a single reading device ensuring the conversion of the output voltage charges, whilst the filters with positive and negative weighting coefficients have two reading devices associated with one differential amplifier. Thus, it is much easier to produce the filters with positive weighting coefficients, whilst their performance characteristics with regard to the residual noise and linearity are improved, due more particularly to the suppression of the common mode signals, of which account must be taken when a differential amplifier is used. Moreover, the syntheses used for these filters lead to higher values for the weighting coefficients and for the sum of these coefficients and consequently to an increased output level for a given input level.

In FIG. 2, the shift register comprises transfer electrodes 30, arranged on an insulating layer covering the substrate, which are parallel to one another and transversely positioned with respect to the direction of the charges. These electrodes ensure the transfer of charges into the substrate in the case of a periodic application of given potentials. The weighting means P for the quantities of charges can be constituted by resistance bridges. They can also be constituted by weighting electrodes 20, interposed on the register with the transfer electrodes. Each weighting electrode is subdivided into at least two elementary electrodes separated, in the charge transfer direction, by a break. A weighted charge quantity can thus be collected beneath elementary electrodes. Like the transfer electrodes, the weighting electrodes ensure the transfer of charges into the substrate in the case of a periodic application of given potentials.

In FIG. 2, a weighting electrode is inserted between each transfer electrode. The transfer and weighting electrodes are respectively subject to the potentials $\phi_1$ and $\phi_2$. A line L makes it possible to collect the quantities of charges beneath one of the elementary electrodes of each weighting electrode and constitutes the summation means 5 of the filter. The reading means 4 for the quantities of electrical charges and the means fixing the sign of the weighting coefficients 3 are constituted in per se known manner by a voltage or current charge reading device D. Device D is coupled to the collection line and supplies an electrical output signal S' shich, like in FIG. 1, is transmitted to the negative input of a differential amplifier 6.

Potential $\phi_2$ can be applied to the elementary electrodes beneath which the charges are collected by lines L by means of the reading device D.

In the prior art recursive filters, the electrical signal S' constitutes the output signal of the filter. In the case of a filter with positive weighting coefficients, it is then necessary to insert between the reading device D and the differential amplifier 6 an amplifier which makes it possible to obtain the output signal of the filter under a low impedance.

The recursive filter with positive weighting coefficients according to the invention makes it possible to render this amplifier superfluous.

Any recursive filter differing from those described through the number of transfer electrodes inserted between each weighting electrode does not pass beyond the scope of the invention.

The invention is applied to the filtering of electrical signals.

What is claimed is:

1. A recursive filter for the transfer of electrical charges comprising:
   a shift register for the transfer of electrical charges having a plurality of stages, said register being realised on a semiconductor substrate covered by an insulating layer, transfer electrodes constituting its stages being arranged on the insulating layer parallel to one another and transversely positioned with respect to the direction of the charges and ensuring the transfer of the charges into the substrate from one register stage to the next on a periodic application of given potentials;
   means ensuring the injection of charges into the shift register located at the register input in the charge transfer direction;
   weighting means connected to the output of the register stages which assign a weighting coefficient to the quantity of charges which has passed through each stage;
   means fixing the sign of the weighting coefficients;
   reading means and summation means for the quantities of weighted charges, said means supplying an electrical signal transmitted to the negative input of a differential amplifier, which at its positive input receives the sampled input voltage of the recursive filter, the differential amplifier output being connected to the charge injection means;
   means ensuring the discharge of charges which have passed through the final register stage; wherein the electrical output signal of the recursive filter is taken, under a low impedance, at the output of the differential amplifier.

2. A filter according to claim 1, wherein the weighting means are constituted by weighting electrodes interposed on the register with the transfer electrodes, each weighting electrode being subdivided into at least two elementary electrodes separated, in the charge transfer direction, by a break, a quantity of weighted charges being collectable beneath each elementary electrode, the transfer and weighting electrodes ensuring the transfer of charges into the substrate on the periodic application of given potentials.

3. A filter according to claim 2, wherein all it weighting coefficients are positive and wherein the algebraic summation means are constituted by a collecting line for the quantities of charges located beneath one of the elementary electrodes of each weighting electrode, the reading means for the quantities of charges and the means fixing the sign of the weighting coefficients being constituted by a charge reading device which is coupled to the collecting line and which supplies the electrical signal transmitted to the negative input of the differential amplifier.

* * * * *